United States Patent [19]
Moorey

[11] 4,107,616
[45] Aug. 15, 1978

[54] SIGNAL MONITORING CIRCUIT

[75] Inventor: Ernest James Moorey, Ivybridge, England

[73] Assignee: M. L. Engineering (Plymouth) Limited, Plymouth, England

[21] Appl. No.: 760,391

[22] Filed: Jan. 18, 1977

[30] Foreign Application Priority Data

Jan. 22, 1976 [GB] United Kingdom ............... 2436/76

[51] Int. Cl.² .......................................... H03K 17/28
[52] U.S. Cl. .................................... 328/110; 328/75; 328/119; 328/130; 307/293
[58] Field of Search ............... 328/109, 110, 129, 130, 328/75; 307/293

[56] References Cited

U.S. PATENT DOCUMENTS

| 3,553,489 | 1/1971 | Spencer et al. ............ 328/110 X |
| 3,751,689 | 8/1973 | Hogg ........................... 328/110 X |
| 3,860,832 | 1/1975 | Aapro .......................... 328/110 X |
| 3,995,223 | 11/1976 | Gimber et al. ................ 328/110 |

Primary Examiner—John S. Heyman
Attorney, Agent, or Firm—Cushman, Darby & Cushman

[57] ABSTRACT

Signals such as track signals in a railway signalling system are monitored by antiphase sequential application to an enabling input of a control circuit which starts the operation of a timer, providing an output signal only if the control circuit is enabled for a time interval during which all the signals being monitored are present sequentially. Absence of any one of the signals in this interval results in a fail-safe condition, resetting the timer, which then fails to provide an output. In the application to a railway signal monitoring system absence of any one signal would be indicative of occupation of an associated track section, resulting in a 'danger' condition being signalled.

4 Claims, 3 Drawing Figures

SIGNAL MONITORING CIRCUIT

The present invention relates to a signal monitoring circuit.

An object of the present specification is to provide a monitoring circuit which provides an output only when a number of inputs being monitored are all present, absence of any one of the inputs resulting in failure of the monitoring circuit to produce the output. The invention is applicable particularly to the monitoring of inputs which are sequential, or time-displaced relative to each other.

According to the present invention there is provided a signal monitoring circuit comprising a timer device the operation of which is controlled by a control circuit having an enabling input provided by sequential combination of two or more switched or oscillatory inputs, derived from signals to be monitored, which enable the control circuit, causing the latter to initiate operation of the timer device, the monitoring circuit providing an output signal only when the control circuit is enabled for a predetermined time interval corresponding to the application of all the inputs sequentially to the enabling input.

Preferably the switched or oscillatory inputs of the control circuit result in a steady enabling voltage at said enabling input only when all the said inputs are present in sequence. The said enabling voltage would preferably be outside the range of voltages obtainable at the enabling input in the absence of any input.

The monitoring circuit has the advantage of being inherently fail-safe in operation in that failure of components of the circuit will not result in spurious operation of the circuit to produce a false output.

The power supply to the control circuit may in practice be constituted by the enabling voltage at the enabling input. This enabling voltage can only result from the presence of one of the inputs. Moreover, unless all the inputs are present sequentially at the enabling input the timer device will fail to time the predetermined time interval, and the monitoring circuit will not provide an output signal.

The circuit according to the invention in effect monitors the presence of all of the inputs, and provides an output signal only when all these inputs are present. The circuit therefore acts effectively as an AND gate.

In practice the inputs to the circuit will be phase-displaced relative to each other in such a way that their time-sequential combination at the enabling input results in the substantially steady enabling voltage.

The input signals may be derived from the demodulation of two or more input oscillatory signals of different frequency. In this way the circuit according to the invention can find practical application in the monitoring of electrical signals in, for example, railway signalling systems, where the presence of two or more electrical signals, detected by suitable detection or receiver means, indicates a first signalling state, while the absence of any one or more of the signals indicates a second signalling state. In a railway signalling system the first signalling state would represent the 'line clear' or 'safe' condition while the second signalling state would correspond to the 'danger' condition.

In a preferred embodiment of the invention the control circuit comprises a switching transistor or gating stage normally biased on and arranged to be biased off when an enabling voltage appears at the enabling input to initiate operation of the timer, the switching transistor or gating stage transmitting pulses from a pulse generator to drive the timer.

The invention will now be further described, by way of example, with reference to the accompanying drawings, in which:

FIG. 3 is a block schematic diagram illustrating the application of the invention to the monitoring of a railway points intersection or track switch.

In the drawings the same reference numerals are employed to indicate the same or corresponding components.

Figure 1:
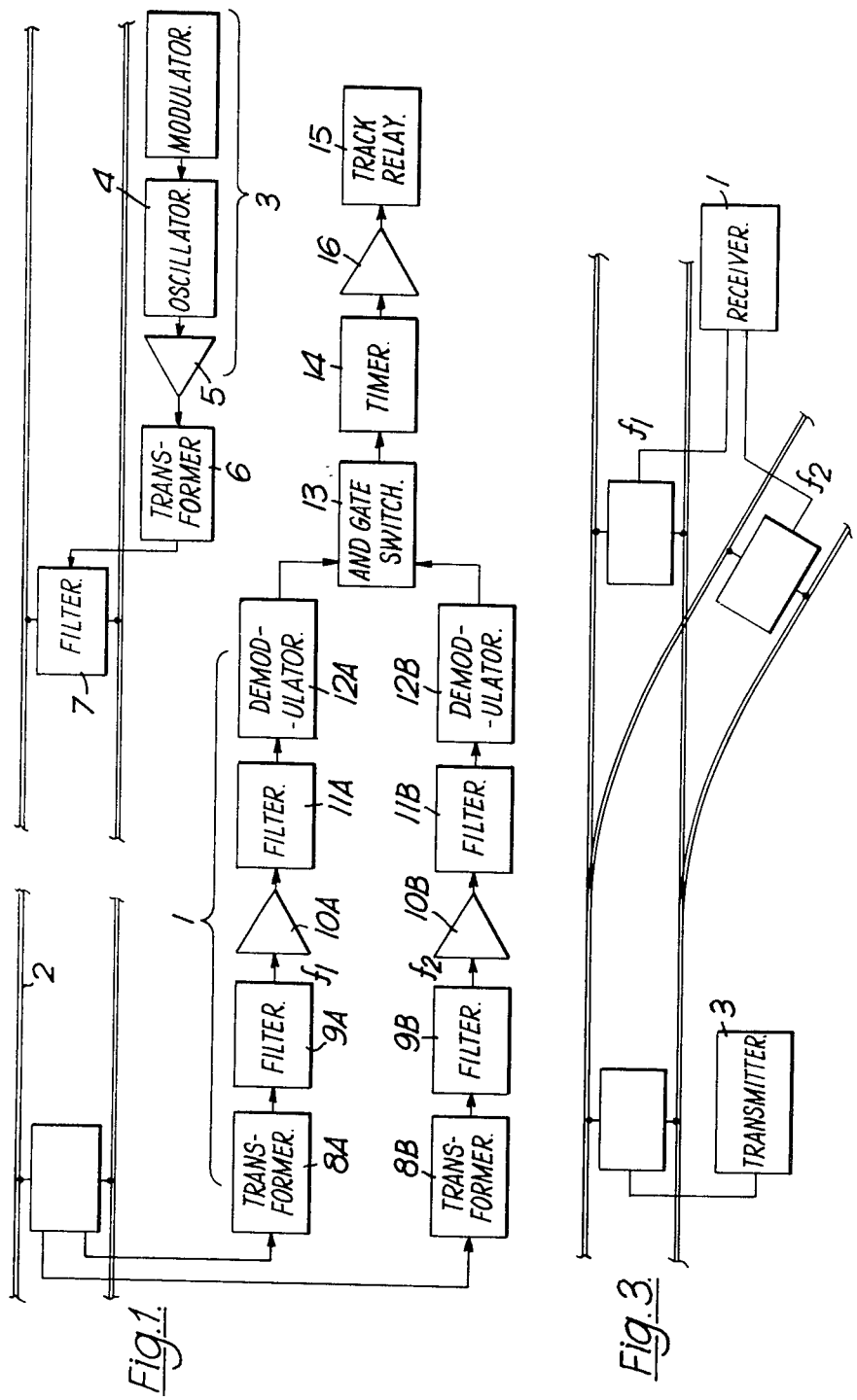
FIG. 1 is a block schematic diagram of part of a railway signalling system including a receiver unit incorporating a monitoring circuit according to the invention.

FIG. 1 shows schematically part of a signalling system including a receiver unit 1 designed to monitor electrical signals transmitted over a section of a railway track indicated diagrammatically at 2. The signals comprise a frequency-shifted signal which alternates between two track frequencies $f_1$ and $f_2$ selected so that they suffer minimal interference from harmonics of any alternating current present in the track, for example, traction current in the case of an electrified railway system. The receiver unit 1 receives the signal after transmission over the section of the track 2 from a transmitter 3. Adjacent sections of the track 2 are isolated from each other electrically by tuning of the associated transmitters and receivers to the relevant track frequencies, which are different for adjoining track sections.

For typical standard gauge track applications the track frequencies may be in the range 1,500 to 2,800 Hz, while for rapid transit railway systems the track frequencies may be up to 10 K Hz.

The transmitter 3 is shown in block schematic form. The two track frequency signals are generated by an oscillator 4 which is frequency-modulated by a modulating frequency typically in the range 1 to 7 Hz. The frequency-modulated carrier signal is amplified by an amplifier 5 to a power level suitable for transmission to the track 2 through a matching transformer 6 and a filter 7 which serves to isolate the transmitter from unwanted A.C. and D.C. voltages present in the track 2.

The receiver unit 1 is shown schematically in FIG. 1 and has two input transformers 8A, 8B which isolate the receiver unit from the track. The two transformers 8A, 8B are connected to respective filters 9A, 9B which are tuned to the higher track frequency $f_1$ and the lower track frequency $f_2$ respectively. Each of the resulting two signals passes through a respective amplifier 10A, 10B, a further filter 11A, 11B, and into a respective demodulator 12A, 12B which provides a respective square wave output signal corresponding to the modulation of the received signals. These signals are combined in a monitoring circuit according to the invention which includes a threshold switch device 13 and a timer 14.

The threshold switch device 13 requires the presence of at least one of the input signals before being triggered to set the timer 14 in operation. After timing a predetermined interval the timer 14 energises a track relay 15 through an amplifier 16. As described with reference to FIG. 2 the timer 14 is so arranged that it will not complete the timing of the predetermined interval unless both the input signals are present. The relay 15 is energised, corresponding to a 'safe' condition of the associated track section, only when both carrier signals are present. The 'dropping out' or de-energisation of the relay 15 will result in the signalling of a 'danger' condition, corresponding for example to the presence of a train on the track section, which will short-circuit the track and prevent the reception by the receiver of at least one of the transmitted track frequencies.

Suitable timer circuit for use as the interval timer 14 are described in our British patent applications Nos. 12116/74 and 16267/76.

Figure 2:
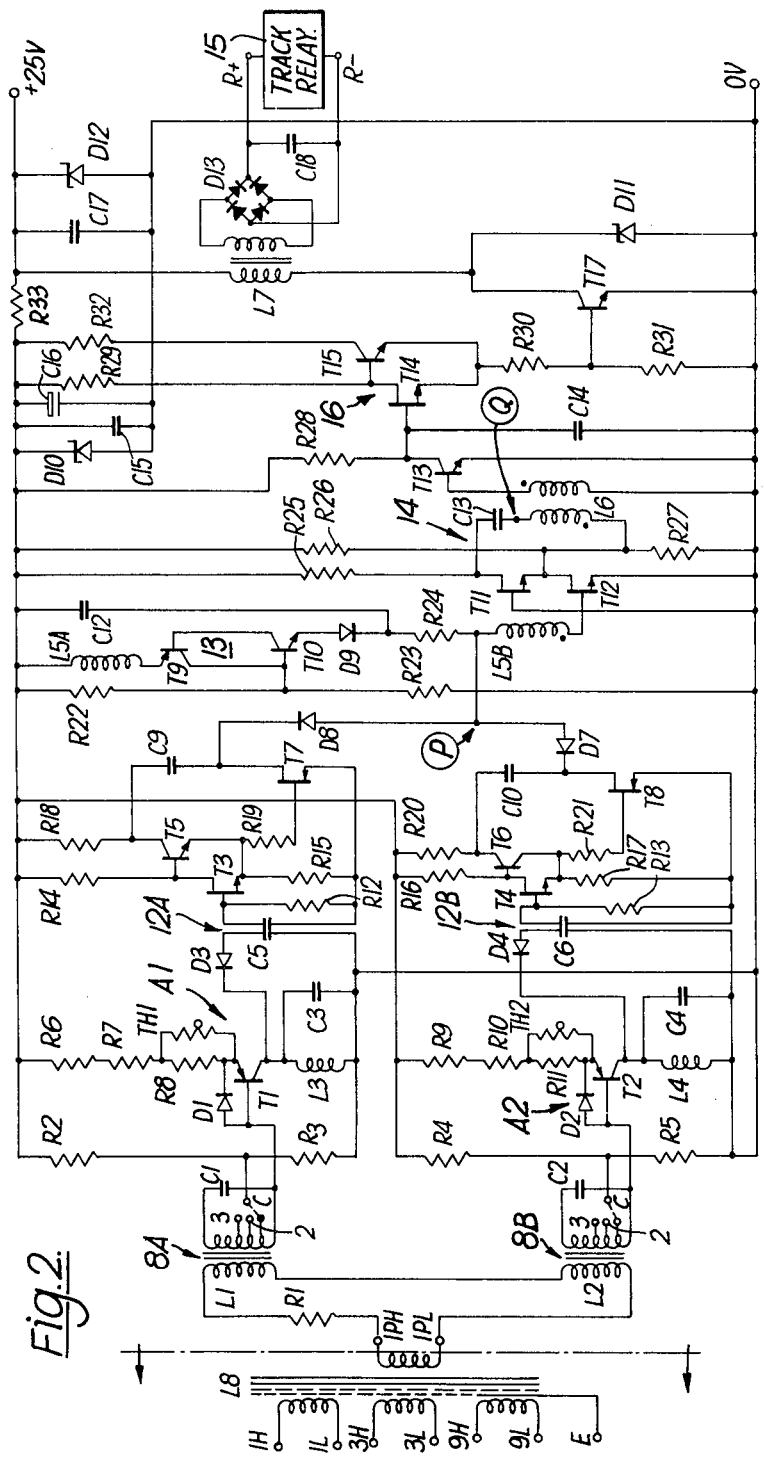
FIG. 2 is a circuit diagram of a practical embodiment of the receiver unit shown in FIG. 1.

The construction and operation of one practical form of monitoring circuit according to the invention and its associated receiver circuit will be apparent from the circuit diagram of FIG. 2.

The signal from the track tuned circuit is fed into the two input transformers 8A, 8B the secondary windings of which are tuned by respective capacitors C1, C2 to the respective frequencies $f_1, f_2$ present in the basic track circuit signal, coming from the transmitter 3. Protection from series mode overload signals is provided by diodes D1, D2. Each signal is then passed through a respective amplifier A1, A2 to a respective second tuned circuit C3, L3; C4, L4 which ensures rejection of unwanted signals. These second tuned circuits are coupled into respective detector and low-pass filter stages D3, C5; D4, C6 which constitute the respective demodulators 12A, 12B.

The received signal in each channel is a rising and falling sine wave at one of the basic track frequencies $f_1$, $f_2$. This signal, after demodulation and smoothing, is used to drive respective transistor switching stages T3, T5 and T4, T6. The outputs of these switching stages are negative potentials, rising and falling at the respective modulation frequencies. The demodulated signals from the two channels are out of phase with each other, so that, when the output from one channel is falling, the output from the other channel is rising, and vice versa. A certain amount of hysteresis is built in to the detecting stages, so that the potential at which each switching stage switches on is higher than the potential at which it switches off.

The negative outputs from the switching stages T5, T6 of the two channels are combined through respective diodes D8, D7 at enabling input P of the threshold switch device 13. The resultant signal at the enabling input P is a negative D.C. signal. The absence of either of the modulation signals will result in interruption of the substantially continuous negative resultant voltage at the input P.

In the circuit of FIG. 2 the threshold switch device 13 is constituted by a pulse generator, formed by transistors T9 and T10, which produces short pulses of the order of 15 nanoseconds duration. The negative D.C. signal at the enabling input P constitutes an enabling voltage which enables a gating stage comprising a field effect transistor T12 which is normally biased on and which is biased off by the negative D.C. signal at the enabling input to enable the timer 14. The output of the pulse generator 13 passes to the gating switch T12, switching it on momentarily to produce a switched output waveform acting as the drive to the timer 14, which in this example comprises a field effect transistor T11 and a timing capacitor C13 which is arranged to be charged through a timing resistor R25. The interval timed by the timer 14 is approximately 2 seconds and the re-set time of the timer is approximately 1 millisecond.

Each momentary switching on of the gating stage T12 causes the timing capacitor C13 to charge progressively through a timing resistor R25, and when the potential at a point Q on the negative side of the timing capacitor C13 is sufficiently low a threshold circuit including a transistor T13 is triggered into operation at the repetition rate of the switch device, that is, the pulse generator 13. The output of this threshold circuit drives the amplifier 16, comprising transistors T14, T15 and T17, which in turn drives a transformer L7 the output of which is rectified and passed to the associated track relay 15 to maintain the latter in an energised condition as long as all the input signals are present at the enabling input P.

The timer 14 will be reset either by removal of one of the input signals, or by a reduction in the power supply to the receiver unit, either of which events will halt the operation of the timer 14, effectively removing the energising input to the track relay 15. The circuit is therefore fail-safe in operation.

The power supply to the receiver unit is regulated by a stabilizing diode D10 and protection against transient overloads on the power supply circuit is provided by means of a power zener diode D12 and low pass filter circuits C15, C16 and C17.

The receiver inputs are electrically isolated from the rest of the circuit by means of the screened isolating input transformer. This is to eliminate the possible effect of common mode input signals from getting through to the filter circuits. The screen on the input transformer is connected to earth. From the input the signal is passed through two filter circuits, each employing passive inductance-capacitance (L-C) filter networks. Should the components of any of these three stages fail, the output from the filters will be reduced.

The low pass filters used in the receiver demodulator stages use respective four-terminal capacitor C5 and C6, having pairs of terminals connected in series to each side of each capacitor to ensure that in the absence of the capacitor, or in the event of failure thereof, no signal appears at the associated switching stage T3, T4.

The outputs from the switching stages T5, T6 are antiphase signals which form at the enabling input P a potential more negative than the zero volt line, so that the switching stages constitute the only power source for the control circuit formed by the gating stage T12. As stated above, the gating stage T12 is normally biased on and is arranged to be biased off by the resulting negative potential at the enabling input P, in turn biasing the transistor T11 of the timer 14 off so that charging of the timing capacitor C13 commences. If the latter potential becomes more positive than a predetermined level, due to the absence of one of the outputs from the switching stages T5, T6, the gating stage T12 will switch on, switching on the transistor T11 and halting the operation of the timer 14. If this discharge condition persists for more than 1 millisecond the capacitor C13 will be discharged and the timer 14 will be reset, so that a new timing cycle will then have to commence.

In the absence of a signal from either one of the channels the negative D.C. potential at the enabling input P will rise and fall, which will cause the gating stage T12 to switch in sympathy. As the delay time of the timer 14, that is, the interval timed thereby, is much longer than a cycle of the modulation frequency the timer 14 will be re-set every time the output from the switching stages returns towards zero, and the timer will consequently never finish its timing cycle, so that the relay 15 will drop out, that is, it will be de-energised.

Should the power supply smoothing components become disconnected, an unsmoothed rectified power supply potential result and the timer will then be re-set every time the power supply drops below about half its value. In this condition no output will result from the monitoring circuit and the relay 15 will again be de-energised.

It will be apparent that the receiver unit has the following fail-safe aspects:

(1) In the absence of any shunt on the associated track section, for example due to the presence of a train, the receiver is sensitive only to signals from its associated transmitter, and from no other source.

(2) Failure of any components in the receiver circuit can never result in an increase in gain of the receiver, or the possibility of the receiver maintaining its output after the input has been removed.

(3) The gain of the receiver cannot increase above specified predetermined limits.

(4) The gain of the receiver cannot be increased by changes in power supply level, or by the removal of smoothing elements in the power supply.

The incorporation of the monitoring circuit in the receiver unit enables a single receiver unit with its associated timer and track relay circuit to be used to monitor a number of track sections simultaneously. For example two or more input signals of different frequency may be applied to the input of the receiver, and thus contribute to the switching potential at the enabling input of the monitoring circuit, these input signals being derived from track sections adjoining a track intersection. Such a track intersection may for example comprise track points where three track sections adjoin the intersection, or a rail crossing where four track sections adjoin the intersection. By employing the monitoring circuit such an intersection can be monitored by a single receiver unit, since the presence of a train on any of the track sections adjoining the intersection will result in de-energisation (dropping out) of the associated track relay and signalling of a 'danger' condition.

FIG. 3 illustrates diagrammatically the application of the monitoring circuit shown in FIG. 1 to the monitoring of a railway points intersection or track switch, the transmitter 3 being in this case connected to one of the track sections adjoining the points, and two input channels for the receiver 1, tuned to different frequencies, being connected to the other two track sections adjoining the points or track switch.

In a typical practical example of the embodiment shown in FIG. 2 the components of the circuit have the values and type designations set out below.

| Transistors: | | Resistors (Ohms): | |
|---|---|---|---|
| T1, T2 | : 2N3962 | R1 | : 22 |
| T3, T4 | : 2N4391 | R2 | : 1.5 K |
| T5, T6 | : 2N2484 | R3 | : 4.7 K |
| T7, T8 | : E270 | R4 | : 1.5 K |
| T9 | : 2N2907 | R5 | : 4.7 K |
| T10 | : 2N2369 | R6 | : S.O.T. |
| T11, T12 | : 2N4391 | R7 | : 5.6 K |
| T13 | : 2N2369 | R8 | : 6.8 K |
| T14 | : 2N4393 | R9 | : S.O.T. |
| T15 | : 2N2222A | R10 | : 5.6 K |
| T17 | : BUY47 | R11 | : 6.8 K |
| Diodes: | | | |
| D1-D4; D7-D9 | : 1N4148 | R12 | : 10 M |

-continued

| | | | |
|---|---|---|---|
| D10 | : 18V 1W | R13 | : 10 M |
| D11 | : 68V 1W | R14 | : 100 K |
| D12 | : 39V 1W | R15 | : 560 |
| D13 | : WO4 | R16 | : 100 K |
| Capacitors (Farads): | | R17 | : 560 |
| C1, C2, C3, C4 | : 0.1μ | R18 | : 4.7 K |
| C5, C6 | : 1n | R19 | : 1 M |
| C9, C10 | : 6.8μ | R20 | : 4.7 K |
| C12 | : 1n | R21 | : 1 M |
| C13 | : 6.8μ | R22 | : 2.2 K |
| C14 | : 470p | R23 | : 2.2 K |
| C15 | : 0.01μ | R24 | : 470 K |
| C16 | : 47μ | R25 | : 470 K |
| C17 | : 0.01μ | R26 | : 2.2 K |
| C18 | : 0.47μ | R27 | : 2.2 K |
| | | R28 | : 220 K |
| | | R29 | : 18 K |
| | | R30 | : 470 |
| | | R31 | : 150 |
| | | R32 | : 470 |
| | | R33 | : 330 |

I claim:

1. A signal monitoring circuit for monitoring the presence of at least two out-of phase input signals, comprising a timer device, a control circuit controlling the operation of the timer device, the control circuit having an enabling input, means combining two out-of-phase signals in a sequential manner derived from said input signals to be monitored, said combining means being connected to the said enabling input of the control circuit to enable the latter and initiate operation of the timer device upon receipt of one of said input signals for a predetermined time, said combining means continuing said enabling input longer than said predetermined time only when the rest of said input signals are thereafter sequentially received, said timer device providing an output signal from the monitoring circuit only when the control circuit is enabled for said predetermined time interval, timed by the timer device, corresponding to the application of all the input signals sequentially to the enabling input.

2. The circuit defined in claim 1, wherein the input signal combining means provide a substantially steady enabling voltage at said enabling input only when all the said input signals are present in sequence.

3. The circuit defined in claim 1, in which the control circuit comprises a gating stage normally biased on and arranged to be biased off by the application of an enabling voltage appears at the enabling input to initiate operation of the timer, and including a pulse generator connected to said gating stage for generating pulses to drive the timer through said gating stage.

4. A signal monitoring circuit for monitoring the presence of at least two signals, comprising a timer device, a control circuit controlling the operation of the timer device, the control circuit having an enabling input, demodulator means for the reception of at least two oscillatory signals of different frequency to be monitored, the demodulator means providing respective input signals, means combining sequentially said input signals derived from said demodulator means, said combining means being connected to the said enabling input of the control circuit to enable the latter and initiate operation of the timer device, said timer device providing an output signal from the monitoring circuit only when the control circuit is enabled for a predetermined time interval, timed by the timer device, corresponding to the application of all the input signals sequentially to the enabling input.

* * * * *